(12) United States Patent
Mayer et al.

(10) Patent No.: US 6,845,027 B2
(45) Date of Patent: Jan. 18, 2005

(54) SEMICONDUCTOR CHIP

(75) Inventors: Albrecht Mayer, Deisenhofen (DE); Andreas Wenzel, München (DE)

(73) Assignee: Infineon Technologies AG, Munich (DE)

(*) Notice: Subject to any disclaimer, the term of this patent is extended or adjusted under 35 U.S.C. 154(b) by 20 days.

(21) Appl. No.: 10/331,535

(22) Filed: Dec. 30, 2002

(65) Prior Publication Data

US 2003/0117828 A1 Jun. 26, 2003

Related U.S. Application Data

(63) Continuation of application No. PCT/DE01/02174, filed on Jun. 12, 2001.

(30) Foreign Application Priority Data

Jun. 30, 2000 (DE) .......................................... 100 30 994

(51) Int. Cl.⁷ ............................................... G11C 7/00
(52) U.S. Cl. ............................ 365/63; 365/51; 686/777
(58) Field of Search ...................... 365/63, 51; 438/109, 438/15; 257/777, 723, 686

(56) References Cited

U.S. PATENT DOCUMENTS

| | | | | |
|---|---|---|---|---|
| 5,285,107 A | * | 2/1994 | Kazami et al. | 257/680 |
| 5,376,825 A | * | 12/1994 | Tukamoto et al. | 257/685 |
| 5,767,009 A | | 6/1998 | Yoshida et al. | 438/613 |
| 5,994,774 A | * | 11/1999 | Siegel et al. | 257/727 |
| 6,420,781 B1 | * | 7/2002 | Wendorff et al. | 257/686 |

FOREIGN PATENT DOCUMENTS

| | | |
|---|---|---|
| EP | 0 486 829 A2 | 5/1992 |
| EP | 0 766 311 A2 | 4/1997 |
| JP | 02005455 | 1/1990 |

OTHER PUBLICATIONS

Synopsis of MacNamee, C.: "Microprocessor Debugging: the Nexus Standard", Elektronik Praxis, No. 3, 2000, pp. 104–106.

Synopsis of Williams, S.: "Software and Hardware Debug Techniques for Single–Chip Systems", Penton Publishing, 1996, pp. 247–256.

* cited by examiner

*Primary Examiner*—Vu A. Le
(74) *Attorney, Agent, or Firm*—Laurence A. Greenberg; Werner H. Stemer; Ralph E. Locher

(57) ABSTRACT

A semiconductor chip is characterized in that some of the contact points for connecting the semiconductor chip to other components of a system that contains the chip is provided for making a connection with another semiconductor chip that can be mounted onto the first semiconductor chip and that enhances the functions and/or the power of the latter. Such a configuration allows a small semiconductor chip to be produced in a cost-effective manner, using minimal resources and the chip can be enhanced by any number of modules, without modifying the characteristics of the system, in which it is contained.

18 Claims, 1 Drawing Sheet

SEMICONDUCTOR CHIP

CROSS-REFERENCE TO RELATED APPLICATION

This application is a continuation of copending International Application No. PCT/DE01/02174, filed Jun. 12, 2001, which designated the United States and was not published in English.

BACKGROUND OF THE INVENTION

Field of the Invention

The present invention relates to a semiconductor chip with contact points for connecting the semiconductor chip to other components of a system containing the semiconductor chip.

Such semiconductor chips have been known for many years in innumerable embodiments.

Semiconductor chips, principally on account of the ever increasing complexity and the ever higher speed at which they operate, have the problem that the users of the semiconductor chips, more precisely the users of the devices containing the semiconductor chips, are often no longer able to identify and rectify the causes of improper functioning of the semiconductor chips and/or of the systems containing the semiconductor chips.

Therefore, so-called emulators have been developed for particularly complex semiconductor chips such as microprocessors and microcontrollers, for example. With the aid of which emulators, during normal operation of the semiconductor chip, internal states and sequences in the semiconductor chip (for example register contents, memory contents, and/or addresses, data, control signals transmitted via internal or external lines or buses, etc.) can be observed and altered as desired.

During the emulation of the semiconductor chip, the latter (the device containing the latter) is generally removed from the system containing it and replaced by a special circuit. The special circuit contains the semiconductor chip that is to be tested (if the semiconductor chip taken from the system is inserted into the special circuit) or a particular embodiment of the semiconductor chip (a so-called bond-out version, which has additional terminals for observing internal states or operations).

Such an emulation has a whole series of disadvantages.

One of the disadvantages is that the removal of the semiconductor chip from the system and the replacement thereof by a circuit of whatever configuration is either not possible at all (for example if the semiconductor chip to be emulated is soldered in or poorly accessible or surrounded by a shielding cage) or else is at least very complicated.

A further disadvantage is that the system often no longer behaves exactly as in normal operation during the emulation of the semiconductor chip to be emulated, on account of the alterations required for this. This has two causes. First because the semiconductor chip to be emulated is replaced by a special circuit, and second because the special circuit usually no longer contains the semiconductor chip itself that is to be emulated, but rather a particular version (the bond-out version already mentioned) of the semiconductor chip.

Furthermore, the development and production of a bond-out version of semiconductor chips are very complicated and expensive. Moreover, bond-out versions are often not commercially available until later than the standard versions of the semiconductor chips.

In order to avoid these disadvantages, one has resorted in the meantime to equipping in particular relatively complex semiconductor chips with a so-called on chip debug support (OCDS). However, the integration of an OCDS module into the semiconductor chip makes the latter considerably larger and more expensive than would be the case without an OCDS module, and is at odds with efforts to produce semiconductor chips in ever smaller and ever inexpensive fashion. This is particularly regrettable because semiconductor chips with an OCDS module are generally not offered without an OCDS module, and because the OCDS module of a semiconductor chip is required at most for the system development, but not for the normal operation of the semiconductor chip.

These disadvantages are even more pronounced if a so-called NEXUS module is integrated into the semiconductor chip.

SUMMARY OF THE INVENTION

It is accordingly an object of the invention to provide a semiconductor chip which overcomes the above-mentioned disadvantages of the prior art devices of this general type, which can be realized in a small and inexpensive fashion and can be emulated with a minimal outlay and without altering the properties of the system containing the semiconductor chip With the foregoing and other objects in view there is provided, in accordance with the invention, a semiconductor circuit. The circuit contains a first semiconductor chip having contact points for connecting to other components of a system containing the first semiconductor chip. A second semiconductor chip is removably disposed on the first semiconductor chip and augments the first semiconductor component in terms of function and/or power. Some of the contact points of the first semiconductor chip are connected to the second semiconductor chip.

The semiconductor chip according to the invention is distinguished by the fact that some of the contact points for connecting the semiconductor chip to other components of a system containing the semiconductor chip is provided for producing a connection to a second semiconductor chip, which can be placed onto the semiconductor chip and augments the latter in terms of function and/or power.

If the components that are necessary for an emulation of the first semiconductor chip are integrated into the second semiconductor chip, then an emulatable semiconductor chip can be made from a non-emulatable semiconductor chip simply by then connecting the second semiconductor chip.

This opens up the possibility that the semiconductor chip—to be emulated—of the emulatable device version is precisely the semiconductor chip that is also used in the non-emulatable standard version of the device. As a result the outlay required for developing and producing an emulatable device version is reduced, and it can be ensured that the emulatable device version and the non-emulatable standard version of the device behave exactly identically under all circumstances.

The need to remove the semiconductor chip to be emulated from the system containing it for emulation purposes and to replace it by a special circuit is even obviated given an appropriate configuration of the second semiconductor chip.

Ultimately, the claimed semiconductor chip can be realized in a small and inexpensive fashion and can be emulated with a minimal outlay and without altering the properties of the system containing the semiconductor chip.

In accordance with an added feature of the invention, the control of the second semiconductor chip, the writing of data to the second semiconductor chip and the reading of data from the second semiconductor chip are effected through the contact points of the first semiconductor chip. And through the contact points, the first semiconductor chip is connected to input and output terminals of the system containing the first semiconductor chip.

In accordance with an additional feature of the invention, the control of the second semiconductor chip, the writing of data to the second semiconductor chip and the reading of data from the second semiconductor chip are effected through a JTAG interface which can also be used for other purposes. Alternatively, a NEXUS interface can be used.

In accordance with another feature of the invention, the second semiconductor chip has contacts points connected to the contact points of the first semiconductor chip, and the second semiconductor chip has no additional contact points.

In accordance with a further feature of the invention, the second semiconductor chip has a smaller area than the first semiconductor chip and the second semiconductor chip is mounted onto the first semiconductor chip using flip-chip technology. The first semiconductor chip can be operated either with or without the second semiconductor chip.

In accordance with a concomitant feature of the invention, a housing is provided and contains the first semiconductor chip and the second semiconductor chip.

Other features which are considered as characteristic for the invention are set forth in the appended claims.

Although the invention is illustrated and described herein as embodied in a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
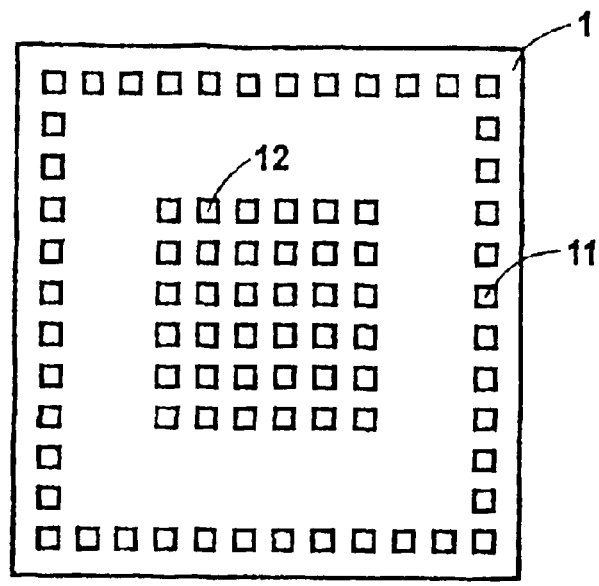
FIG. 1 is a diagrammatic, plan view of a first semiconductor chip according to the invention.

Referring now to the figures of the drawing in detail and first, particularly, to FIG. 1 thereof, there is shown a semiconductor chip 1 which is a microprocessor or microcontroller. However, it should already be pointed out at this juncture that the special features—explained below—of the semiconductor chip 1 can also be provided for any other semiconductor chip in which there is a need to augment the functionality and/or performance thereof as required.

The semiconductor chip 1 described is distinguished by the fact that some of its contact points for connecting the semiconductor chip 1 to other components of a system containing the semiconductor chip 1 is provided for producing a connection to a second semiconductor chip 2. The second semiconductor chip 2 can be placed onto the semiconductor chip 1 and augments the latter in terms of function and/or power.

FIG. 1 shows a plan view of contact points 11, 12 of the semiconductor chip 1, more precisely of that side of the semiconductor chip 1 which is provided with the contact points 11, 12.

As can be seen from FIG. 1, the semiconductor chip 1 has a multiplicity of contact points 11 disposed along the edge of the semiconductor chip 1 and a multiplicity of contact points 12 disposed in a central region of the semiconductor chip 1.

Both the contact points 11 and the contact points 12 serve for connecting the semiconductor chip 1 to other components of a system containing the semiconductor chip 1.

The contact points 11 are connected to the input and/or output terminals of a device containing the semiconductor chip 1. So-called pads are involved, which are configured such that they can be connected via bonding wires to the input and/or output terminals of the device containing the semiconductor chip 1.

The contact points 12 are provided for producing a connection to the second semiconductor chip 2 that can be placed onto the first semiconductor chip 1. Pads are involved which allow the second semiconductor chip 2, more precisely assigned pads thereof, to be connected to the first semiconductor chip 1 using so-called flip-chip technology.

Figure 2:
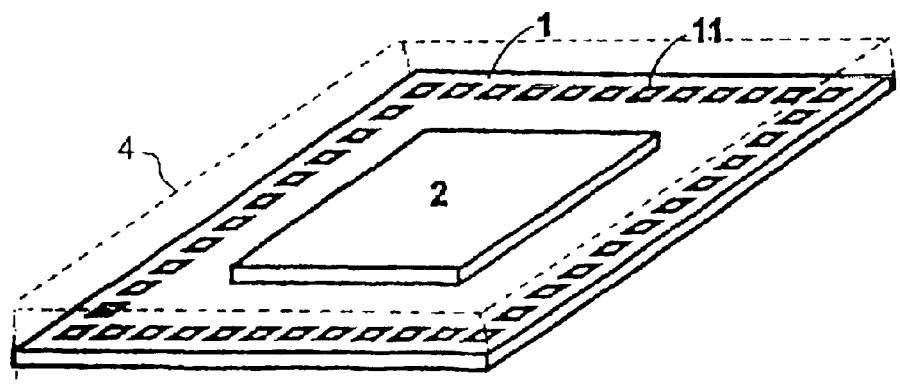
FIG. 2 is a perspective view of a state in which the semiconductor chip shown in FIG. 1 is connected to a second semiconductor chip placed thereon.

The state in which the second semiconductor chip 2 is placed onto the first semiconductor chip 1 and connected thereto via the contact points 12 is illustrated in FIG. 2.

As can be seen from FIG. 2, the second semiconductor chip 2 is significantly smaller than the first semiconductor chip 1, so that after the second semiconductor chip 2 has been placed onto the first semiconductor chip 1, the contact elements 11 of the first semiconductor chip 1 are not covered and are freely accessible.

As has already been mentioned above, the contact points 11 of the first semiconductor chip 1 are connected via bonding wires to the input and/or output terminals of a device containing the semiconductor chip 1.

The second semiconductor chip 2 has no further contact points besides the contact points which it must have in order to be connected to the first semiconductor chip 1, and does not have to be connected to the input and/or output terminals of a device containing the semiconductor chips. If it is necessary to address the second semiconductor chip 2 from outside the device containing the semiconductor chips, this is effected via the contact points 11 of the first semiconductor chip 1, the first semiconductor chip 1 and the contact points 12 of the first semiconductor chip 1. The contact points 11 of the first semiconductor chip 1 contain all the terminals which are necessary in order to be able to operate both the first semiconductor chip 1 and the second semiconductor chip 2 as desired.

In the example considered, the first semiconductor chip 1 is the chip that is actually of interest to the user, for example the microprocessor or the microcontroller that the user wishes to use. The second semiconductor chip 2 is an optional addition that serves for augmenting the functionality and/or the performance of the first semiconductor chip 1. In other words, the first semiconductor chip 1 can optionally be used by itself or in combination with the second semiconductor chip 2.

In the present case, the second semiconductor chip 2 contains components that are necessary or useful for an emulation of the first semiconductor chip 1. The components include, for example, logic components, generally referred to as breakpoint logic or watch-point logic, for setting and monitoring the achieving of specific conditions (for example access to a specific address, reading and/or writing and/or use of specific data, execution of a specific instruction, occurrence of a specific control signal, etc.). A so-called trace memory are used, and in which are continuously stored, of interest, memory or register contents, data, addresses and/or control signals which occur within a definable time window. A compression unit for compressing the data to be written to the trace memory and/or the data to be output from the trace memory. Additional memories, which can replace, as required, read-only memories (ROMS) contained in the first semiconductor chip 1, or memories whose contents can be altered only in a complicated manner (flash memories, EPROMS, EEPROMS, etc.).

The construction and the content of the semiconductor chips make it possible, using one and the same semiconductor chip (using the first semiconductor chip 1 that is actually of interest to the user), to produce two different device versions, namely, a version containing "only" the first semiconductor chip 1, that is to say a non-emulatable standard version, and a version containing the first semiconductor chip 1 and the second semiconductor chip 2, that is to say an emulatable emulator version.

By virtue of the fact that, on account of the capability of combination with the second semiconductor chip 2, the first semiconductor chip 1 does not have to have components enabling debugging or emulation of the first semiconductor chip 1, it can be produced in very small fashion. The fact that the first semiconductor chip 1 has to have additional contact points 12 for controlling the second semiconductor chip 2, for writing data to the second semiconductor chip 2 and/or for reading data from the second semiconductor chip 2 makes the first semiconductor chip 1 only insignificantly larger and more expensive, if at all, than it would be without these terminals. This is because only a few additional terminals have to be provided therefor, for example a JTAG interface, as is also used in some instances for addressing OCDS modules, or a (preferably narrow) NEXUS interface. Under certain circumstances, for addressing the second semiconductor chip 2, it is even possible to use an interface which the first semiconductor chip 1 has to have anyway and/or which can also be used or is used for purposes other than for addressing the second semiconductor chip 2.

The small size of the first semiconductor chip 1 enables the standard device containing the chip also to be produced in very small and inexpensive fashion. This complies with the need for devices that are not larger and/or more expensive than is absolutely necessary for normal use (use in the finished developed system operating without any errors).

The above-described construction of the first semiconductor chip 1 and the small size thereof furthermore enable the emulator version of the device containing the first semiconductor chip 1 also to be produced in very small and inexpensive fashion.

The emulator version of the device containing the first semiconductor chip is not even larger than the standard version.

Since the second semiconductor chip 2 that is placed onto the first semiconductor chip 1 in this case has a smaller area than the first semiconductor chip 1 and does not project beyond the latter laterally, the area of the emulator version of the device does not become larger than the area of the standard version.

However, the emulator version is not higher than the standard version either. This is because the second semiconductor chip 2 (placed directly onto the first semiconductor chip 1) is not or is at most insignificantly higher than the loops of the bonding wires by which the contact points 11 of the first semiconductor chip 1 are connected to the input and/or output terminals of the device containing the first semiconductor chip 1 or first semiconductor chip 1 and second semiconductor chip 2.

Thus, the same housing 4 can be used for the standard version and for the emulator version of the device containing the first semiconductor chip 1.

The emulator version of the device is furthermore distinguished by the fact that that part thereof which is to be emulated, namely the first semiconductor chip 1 thereof, has exactly the same construction as the semiconductor chip used in the standard version of the device. As a result, the emulator version and the standard version of the device behave completely identically down to the last detail under all circumstances.

The connection between the first semiconductor chip 1 and second semiconductor chip 2 is preferably effected by a defined standard interface with which all semiconductor chips in which there might be a need to emulate the relevant semiconductor chip are equipped. The second semiconductor chip 2 can then be combined with any desired first semiconductor chips and does not have to be developed anew for each semiconductor chip.

In the example considered, the trace memory already mentioned, which is preferably contained in the second semiconductor chip 2, is configured as a circular buffer and:

a) permanently records preferably (for example using a multiplexer) selectable data, addresses, and/or control signals;

b) interrupts (preferably with an adjustable follow-up) the recording when a set break point or watch point is reached; and c) can be read as required serially via the JTAG interface already mentioned, or the NEXUS interface likewise already mentioned, or some other interface.

As has already been mentioned above, the second semiconductor chip 2 that is configured in the manner described above and can be combined with other semiconductor chips can be used not only for the emulation of the first semiconductor chip 1. It may additionally or alternatively fulfill arbitrary other functions as well, for example provide additional memory, an A/D converter, a cryptography unit and/or arbitrary other components for the first semiconductor chip 1.

We claim:

1. A semiconductor circuit, comprising:
   a first semiconductor chip having contact points for connecting to other components of a system containing said first semiconductor chip; and
   a second semiconductor chip disposed on said first semiconductor chip and augments said first semiconductor component in terms of at least one of function and power, some of said contact points of said first semiconductor chip connected to said second semiconductor chip, said second semiconductor chip containing components emulating said first semiconductor chip.

2. The semiconductor circuit according to claim 1, wherein control of said second semiconductor chip, writing data to said second semiconductor chip and reading the data from said second semiconductor chip are effected through said contact points of said first semiconductor chip, and through said contact points said first semiconductor chip is connected to input and output terminals of the system containing said first semiconductor chip.

3. The semiconductor circuit according to claim 2, wherein the control of said second semiconductor chip, the writing of the data to said second semiconductor chip and the reading of the data from said second semiconductor chip are effected through a JTAG interface which can also be used for other purposes.

4. The semiconductor circuit according to claim 2, wherein the control of said second semiconductor chip, the writing of the data to said second semiconductor chip and the reading of the data from said second semiconductor chip are effected through a NEXUS interface.

5. The semiconductor circuit according to claim 1, wherein said second semiconductor chip has contacts points connected to said contact points of said first semiconductor chip, said second semiconductor chip having no additional contact points.

6. The semiconductor circuit according to claim 1, wherein said second semiconductor chip has a smaller area than said first semiconductor chip.

7. The semiconductor circuit according to claim 1, wherein said second semiconductor chip is mounted onto said first semiconductor chip using flip-chip technology.

8. The semiconductor circuit according to claim 1, wherein said first semiconductor chip can be operated either with or without said second semiconductor chip.

9. The semiconductor circuit according to claim 1, further comprising a housing containing said first semiconductor chip and said second semiconductor chip.

10. A semiconductor circuit, comprising:
a semiconductor chip having contact points for connecting to other components of a system containing said semiconductor chip, some of said contact points provided for connecting to a further semiconductor chip, said further semiconductor chip being disposed on said semiconductor chip and augments said semiconductor chip in terms of at least one of function and power, said second semiconductor chip containing components emulating said first semiconductor chip.

11. The semiconductor circuit according to claim 10, wherein control of the further semiconductor chip, writing data to the further semiconductor chip and reading the data from the further semiconductor chip are effected through said contact points of said semiconductor chip, and through said contact points said semiconductor chip is connected to input and output terminals of the system containing said semiconductor chip.

12. The semiconductor circuit according to claim 11, wherein the control of the further semiconductor chip, the writing of the data to the further semiconductor chip and the reading of the data from the further semiconductor chip are effected through a JTAG interface which can also be used for other purposes.

13. The semiconductor circuit according to claim 11, wherein the control of the further semiconductor chip, the writing of the data to the further semiconductor chip and the reading of the data from the further semiconductor chip are effected through a NEXUS interface.

14. The semiconductor circuit according to claim 10, wherein the further semiconductor chip has contacts points connected to said contact points of said semiconductor chip, said further semiconductor chip having no additional contact points.

15. The semiconductor circuit according to claim 10, wherein the further second semiconductor chip has a smaller area than said semiconductor chip.

16. The semiconductor circuit according to claim 10, wherein the further semiconductor chip is mounted onto said semiconductor chip using flip-chip technology.

17. The semiconductor circuit according to claim 10, wherein said semiconductor chip can be operated either with or without the further semiconductor chip.

18. The semiconductor circuit according to claim 10, further comprising a housing containing said semiconductor chip and the further semiconductor chip.

* * * * *